United States Patent
Fan (10) Patent No.: US 7,633,143 B1
(45) Date of Patent: Dec. 15, 2009

(54) SEMICONDUCTOR PACKAGE HAVING PLURAL CHIPS SIDE BY SIDE ARRANGED ON A LEADFRAME

(75) Inventor: Wen-Jeng Fan, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 0 days.

(21) Appl. No.: 12/234,894

(22) Filed: Sep. 22, 2008

(51) Int. Cl.
*H01L 23/495* (2006.01)
(52) U.S. Cl. ...................... 257/676; 257/666
(58) Field of Classification Search .......... 257/676, 257/666, 723, 724
See application file for complete search history.

(56) References Cited

U.S. PATENT DOCUMENTS

| | | | |
|---|---|---|---|
| 5,057,906 A * | 10/1991 | Ishigami | 257/706 |
| 6,307,257 B1 * | 10/2001 | Huang et al. | 257/676 |
| 7,449,774 B1 * | 11/2008 | Jeun et al. | 257/712 |
| 2002/0140068 A1 * | 10/2002 | Lee et al. | 257/676 |
| 2002/0153599 A1 * | 10/2002 | Chang et al. | 257/676 |

* cited by examiner

*Primary Examiner*—S. V Clark
(74) *Attorney, Agent, or Firm*—Muncy, Geissler, Olds & Lowe, PLLC (57) ABSTRACT

A semiconductor package with multiple chips side-by-side disposed on a leadframe is revealed, primarily comprising a plurality of leads of a leadframe, a first chip, a second chip, and an encapsulant to encapsulate the chips where the chip thickness of the second chip is larger than the one of the first chip. The first chip and the second chip are individually disposed on a first die-attaching area and on a second die-attaching area of the leads or a die pad of the leadframe. The second die-attaching area is downset relative to the first die-attaching area in a manner that a bottom surface of the encapsulant is closer to the second die-attaching areas than to the first die-attaching areas. Therefore, when chips with different thicknesses are side-by-side disposed, there is no unbalanced mold flow nor package warpage issue.

14 Claims, 6 Drawing Sheets

SEMICONDUCTOR PACKAGE HAVING PLURAL CHIPS SIDE BY SIDE ARRANGED ON A LEADFRAME

FIELD OF THE INVENTION

The present invention relates to semiconductor packages, especially to semiconductor packages with multiple chips side-by-side disposed on a leadframe.

BACKGROUND OF THE INVENTION

In the conventional semiconductor packages, leadframes are widely implemented as chip carriers and electrical media where bonding wires are used as internal electrical connections and encapsulant is used to encapsulate the chips and the bonding wires. For multi-chip semiconductor packages, the arrangement of the multiple chips can be divided into side-by-side arrangement and stacked arrangement where the side-by-side arrangement is to individually attach a plurality of chips (or called as dice) onto a leadframe and is suitable for the semiconductor package with limited heights. However, when the chip thicknesses are different, the thicker chip will make the top molding gap from the top surface of the thicker chip to the top surface of the encapsulant to be smaller causing a larger gap ratio of the bottom molding gap to the top molding gap leading to different filling speeds between the bottom molding gap and the top molding gap during encapsulation where encapsulated voids will easily be formed during the molding processes. Furthermore, since the top molding gap becomes smaller, the bonding wires will be easily exposed from the encapsulant leading to lower assembling yields of the side-by-side arranged multi-chip semiconductor packages. Moreover, the encapsulant volumes above and below the chips will be different leading to warpage issues of the semiconductor packages.

SUMMARY OF THE INVENTION

The main purpose of the present invention is to provide a semiconductor package with multiple chips side-by-side disposed on a leadframe where the leadframe has different downsets formed at the chip attaching areas to attach chips with different thicknesses to improve the issues of unbalanced mold flows, exposed bonding wires, and package warpage.

According to the present invention, a semiconductor package with multiple chips side-by-side disposed on a leadframe is revealed, primarily comprising a plurality of leads and a die pad of the leadframe, a first chip, a second chip, and an encapsulant. The die pad includes a first die-attaching area and a second die-attaching area where the first die-attaching area and the second die-attaching area are horizontally disposed with a downset difference. The first chip is attached to the first die-attaching area of the die pad and the second chip to the second die-attaching area of the die pad. The encapsulant encapsulates the internal lead portions of the leads, the die pad, the first chip, and the second chip where the thickness of the second chip is larger than the one of the first chip and the second die-attaching area is downset relative to the first die-attaching area in a manner that a bottom surface of the encapsulant is closer to the second die-attaching area than to the first die-attaching area.

According to the present invention, another semiconductor package with multiple chips side-by-side disposed on a leadframe is revealed, primarily comprising a plurality of leads of the leadframe, a first chip, a second chip, and an encapsulant. Each lead has an internal lead portion and an external lead portion where the internal lead portion includes a first die-attaching area, a second die-attaching area and a tilted lead portion where the first die-attaching area and the second die-attaching area are horizontally disposed with a downset difference and connected together by the tilted lead portion. The first chip is attached to the first die-attaching areas of the internal lead portions and the second chip to the second die-attaching areas of the internal lead portions. The encapsulant encapsulates the internal lead portions of the leads, the first chip, and the second chip with the external lead portions exposed where the thickness of the second chip is larger than the one of the first chip and the second die-attaching areas are downset relative to the first die-attaching areas in a manner that a bottom surface of the encapsulant is closer to the second die-attaching areas than to the first die-attaching areas.

According to the present invention mentioned above, the semiconductor package has the following effects and advantages:

1. Since the downset of the second die-attaching area is larger than the one of the first die-attaching area, the first chip and the second chip with different die thicknesses can easily be side-by-side disposed on the corresponding die-attaching areas without any unbalanced mold flows leading to encapsulated voids nor different encapsulant volumes above and below the chips leading to package warpage.
2. The distance between the top surface of the thicker chip and the top surface of the encapsulant can be increased by using a larger downset at the corresponding die-attaching area to increase the thickness of the encapsulant on top of the thicker chip to avoid the exposure of the bonding wires.
3. The attaching strength of the second die-attaching area for thicker chip can be enhanced by using proper connections with a die pad or leads to avoid tilting during molding process.

DETAIL DESCRIPTION OF THE INVENTION

Please refer to the attached drawings, the present invention is described by means of embodiments below.

Figure 1:
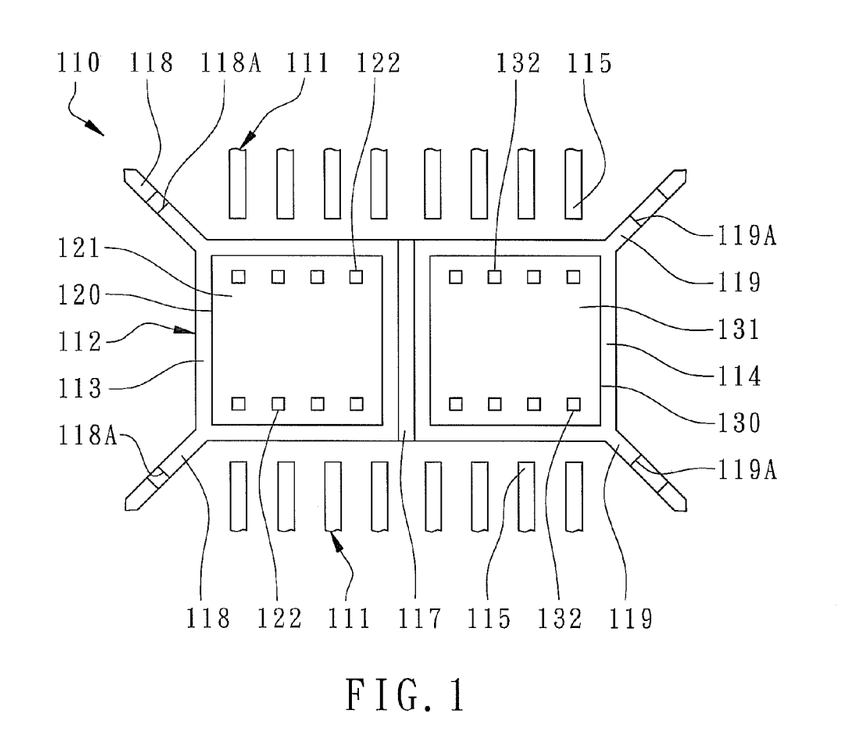
FIG. 1 is a top view of a semiconductor package after removing some components according to the first embodiment of the present invention.
Figure 2:
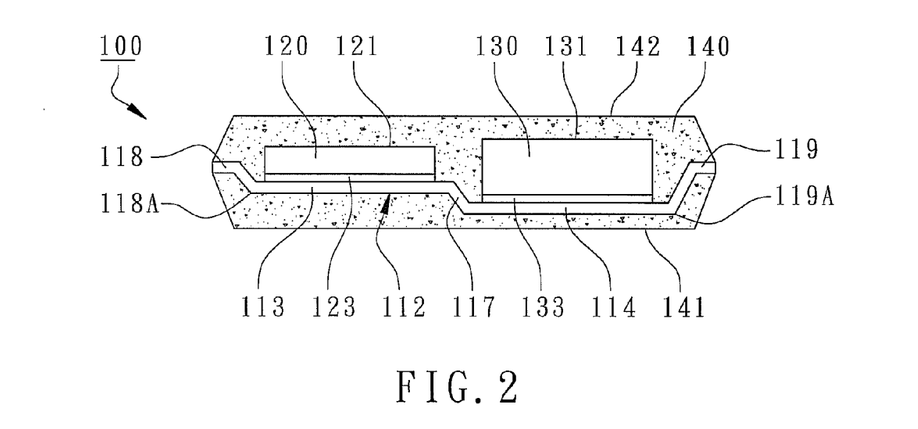
FIG. 2 is a cross-sectional view of the semiconductor package taken along the die pad and the tie bar according to the first embodiment of the present invention.
Figure 3:
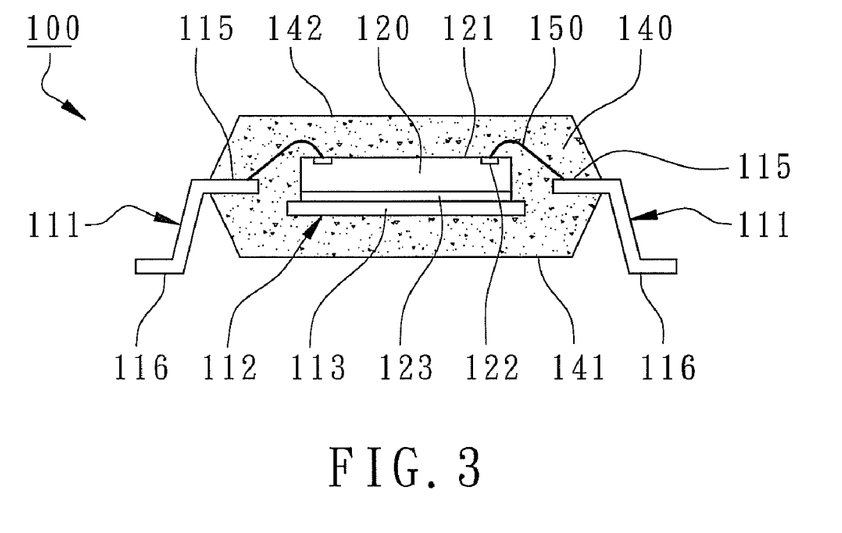
FIG. 3 is a cross-sectional view of the semiconductor package taken along the first chip and the leads according to the first embodiment of the present invention.
Figure 4:
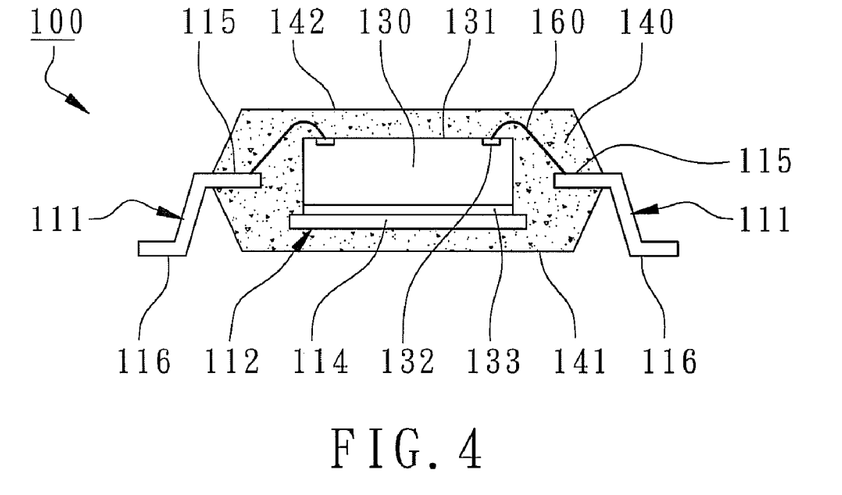
FIG. 4 is a cross-sectional view of the semiconductor package taken along the second chip and the leads according to the first embodiment of the present invention.

According to the first embodiment of the present invention, a semiconductor package with multiple chips side-by-side disposed on a leadframe is revealed in FIG. 1 to show the top view after removing some components, in FIG. 2 to show the cross-sectional view taken along the die pad and the tie bar, in FIG. 3 to show the cross-sectional view taken along the first chip and the leads, and in FIG. 4 to show the cross-sectional view taken along the second chip and the leads.

The semiconductor package 100 primarily comprises a plurality of leads 111 and a die pads 112 of a leadframe 110, a first chip 120, a second chip 130, and an encapsulant 140 where the first chip 120 and the second chip 130 are disposed on the die pad 112 in side-by-side arrangement with different chip thicknesses.

As shown in FIG. 1, the leads 111 are disposed adjacent to the sides of the die pad 112 and have the same metal material as the die pad 112. As shown in FIG. 3, the leads 111 have a plurality of internal lead portions 115 located inside the encapsulant 140 for internal electrical connections to the first chip 120 and to the second chip 130. The leads 111 further have a plurality of external lead portions 116 extended from two corresponding or four sides of the encapsulant 140 for external electrical connections to an external printed circuit board, not shown in the figures. The external lead portions 116 can be bent into gull leads or other shapes such as I or J shapes.

The die pad 112 includes a first die-attaching area 113 and a second die-attaching area 114 where the first die-attaching area 113 and the second die-attaching area 114 are horizontally disposed but formed on different downset planes. The die pad 112 is a metal plate with a width larger than the one of the leads 111. As shown in FIGS. 1 and 2, the leadframe 110 further has a plurality of tie bars 118 and 119 individually connecting the corners of the die pad 112 where the tie bars 118 and 119 are formed at the same time and on the same metal frame as the die pad 112 with appropriate thicknesses to support the die pad 112.

The first chip 120 is disposed on the first die-attaching area 113 of the die pad 112. In the present embodiment, as shown in FIG. 3, the first chip 120 has a first active surface 121 and a plurality of first bonding pads 122 where the first bonding pads 122 are disposed on the peripheries of the first active surface 121. Some of the internal lead portions 115 of the leads 111 are extended toward the first bonding pads 122. The semiconductor package 100 further includes a first die-attaching material 123 formed between the first chip 120 and the first die-attaching area 113 to firmly hold the first chip 120 on the die pad 112. As shown in FIG. 3 again, the semiconductor package 100 further comprises a plurality of first bonding wires 150 to electrically connect the first bonding pads 122 of the first chip 120 to the internal lead portions 115 of the leads 111.

The second chip 130 is attached to the second die-attaching area 114 of the die pad 112. In the present embodiment, as shown in FIG. 4, the second chip 130 has a second active surface 131 and a plurality of second bonding pads 132 formed on the peripheries of the second active surface 131. Some of the internal lead portions 115 of the leads 111 are extended toward the second bonding pads 132. The semiconductor package 100 further comprises a second die-attaching material 133 formed between the second chip 130 and the second die-attaching area 114 to firmly hold the second chip 130 on the die pad 112. As shown in FIG. 4, the semiconductor package 100 further comprises a plurality of second bonding wires 160 to electrically connect the second bonding pads 132 of the second chip 130 to the internal lead portions 115 of the leads 111.

The encapsulant 140 encapsulates the internal lead portions 115 of the leads 111, the die pad 112, the first chip 120, and the second chip 130 to avoid contamination of the first chip 120 and the second chip 130 where the encapsulant 140 is normally formed by transfer molding. In addition, the external lead portions 116 of the leads 111 are extended and exposed from the encapsulant 140.

Furthermore, the thickness of the second chip 130 is larger than the one of the first chip 120 and the second die-attaching area 114 is downset relative to the first die-attaching area 113 in a manner that a bottom surface 141 of the encapsulant 140 is closer to the second die-attaching area 114 than to the first die-attaching area 113 (as shown in FIGS. 2 to 4). In this embodiment, as shown in FIG. 2, a tilted downset bend 117 is formed between the first die-attaching area 113 and the second die-attaching area 114 to make the second die-attaching area 114 is lower than the first die-attaching area 113. In other words, the molding gap from the first die-attaching area 113 to the bottom surface 141 of the encapsulant 140 is larger than the one from the second die-attaching area 114 to the bottom surface 141 of the encapsulant 140. In a detailed structure, the downset bend 117 is a tilted strip. As shown in FIG. 2, since the second die-attaching area 114 is lower than the first die-attaching area 113 and the active surface 131 of the second chip 130 is higher than the first active surface 121 of the first chip 120, a middle horizontal line of the second chip 130 is approximately aligned with the one of the first chip 120.

In the present embodiment, as shown in FIG. 2, the downset depth of the second die-attaching area 114 relative to the first die-attaching area 113 is approximately half of the chip thickness difference between the first chip 120 and the second chip 130. To be more specific, as shown in FIG. 3, the first die-attaching area 113 can be relatively more downset than the internal lead portions 115 of the leads 111, but as shown in FIG. 2, the downset depth of the first die-attaching area 113 is smaller than the one of the second die-attaching area 114.

The formation method of different downset depths is described as follows, as shown in FIGS. 1 and 2. The tie bars 118 are adjacent to the external corners of the first die-attaching area 113 with one or more downset bends 118A formed to make the first die-attaching area 113 downset. The tie bars 119 are adjacent to the external corners of the second die-attaching area 114 with one or more downset bends 119A formed to make the second die-attaching area downset where the downset bends 119A are longer than the downset bends 118A to achieve the bottom surface 141 of the encapsulant 140 is closer to the second die-attaching area 114 than to the first die-attaching area 113.

Therefore, by designing the first die-attaching area 113 and the second die-attaching area 114 at different horizontal planes to side-by-side dispose the first chip 120 and the second chip with different chip thicknesses to reduce the difference between the molding gap from the second chip 130 to the top surface 142 of the encapsulant 140 and the one from the second chip 130 to the bottom surface 141 of the encapsulant 140 so that the speeds of the top mold flow and the bottom mold flow at the second chip 130, i.e., the thicker chip, are approximately the same to improve the issue of unbalanced mold flow to further avoid encapsulated voids. Furthermore, the volume differences of the encapsulant 140 on the top and at the bottom of the second chip 130 or the first chip 120 can be reduced or even no difference so that the semiconductor packages 100 will not experience warpage issues during the curing of the encapsulant 140. Moreover, since the second die-attaching area 114 is the design of second downset to increase the distance from the top surface 142 of the encapsulant 140 to the second active surface 131 of the second chip 130, so that there are more space for wire bonding to avoid the exposure of the second bonding wires 160 from the encapsulant 140 leading to higher assemble yield of the semiconductor package 100.

Figure 5:
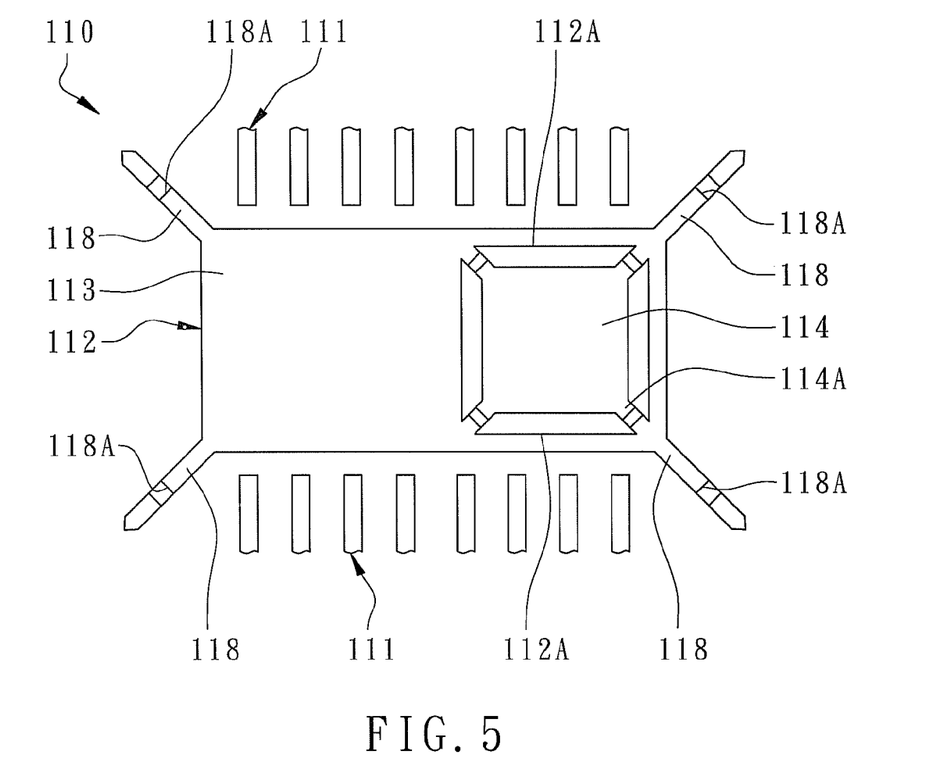
FIG. 5 is a top view of a semiconductor package after removing some components according to the second embodiment of the present invention.

The second embodiment of the present invention is described in FIG. 5 where the basic structure of the present embodiment is about the same as the first embodiment with the same figure numbers for the major components such as the leads 111 and the die pad 112 of the leadframe 110, the first chip 120, the second chip 130, and the encapsulant 140 which are not be described in detail again. The die pad 112 includes the first die-attaching area 113 and the second die-attaching area 114 where the first die-attaching area 113 and the second die-attaching area 114 are horizontally disposed in different planes with different downset depths to dispose different thicknesses of chips. In the present embodiment, the second die-attaching area 114 can be a daughter die pad, i.e., a small die pad is included in the mother die pad 112, as shown in FIG. 5. A plurality of slots 112A are formed at the peripheries of the daughter die pad. A plurality of sub-tie bars 114A are formed by the slots 112A to connect the corners of the second die-attaching area 114 to the die pad 112 where the sub-tie bars 114A are downset bends to make the second die-attaching area 114 more downset than the first die-attaching area 113. As shown in FIG. 5 again, the tie bars 118 connect the corners of the die pad 112 with one or more downset bends 118A of equal lengths to make the die-attaching area 113 as first downset where the second die-attaching area 114 has a second downset lower than the first die-attaching area 113 by the daughter die pad design to enhance the fixing strength of the second downset to avoid tilting during molding processes.

Figure 6:
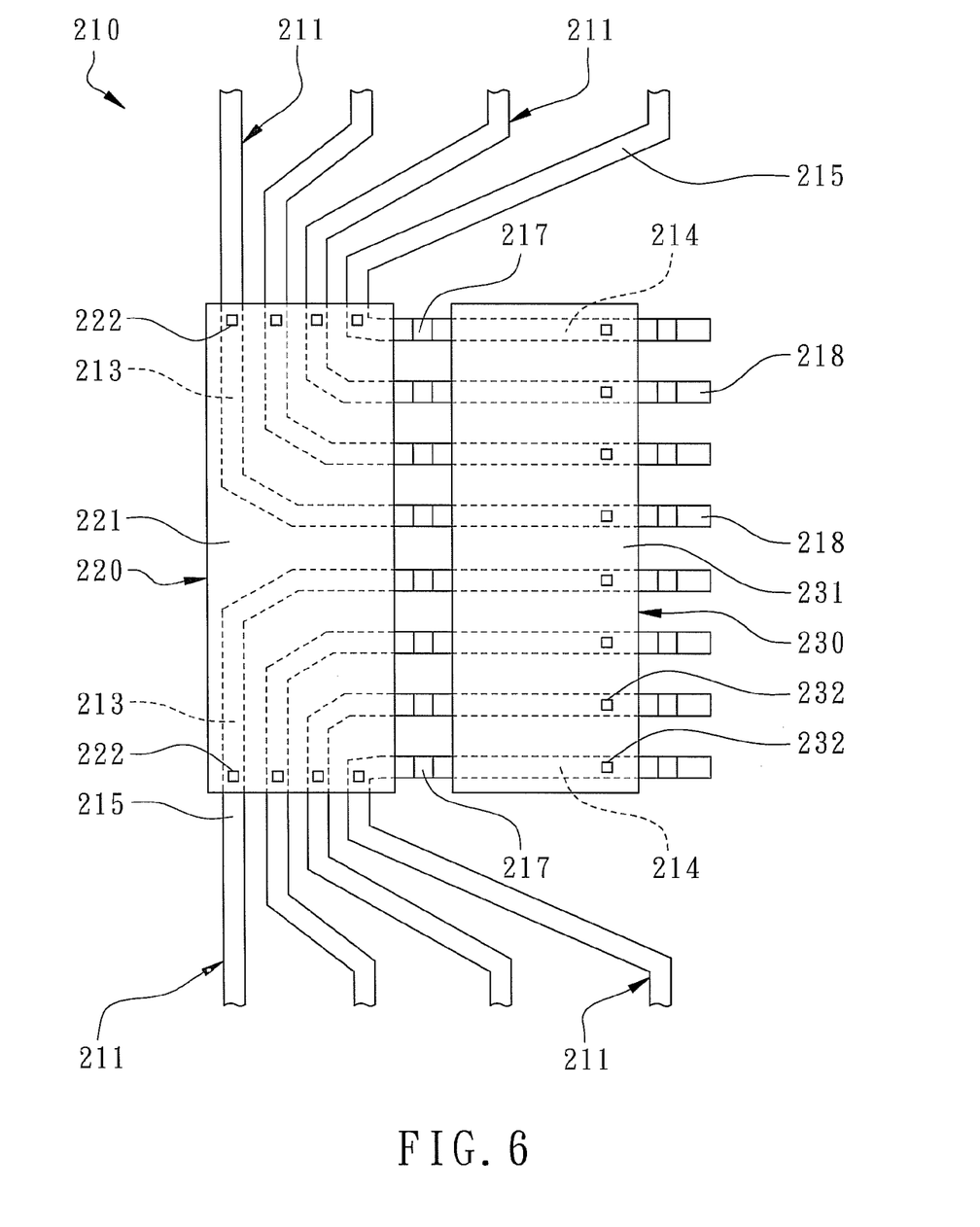
FIG. 6 is a top view of a semiconductor package after removing some components according to the third embodiment of the present invention.
Figure 7:
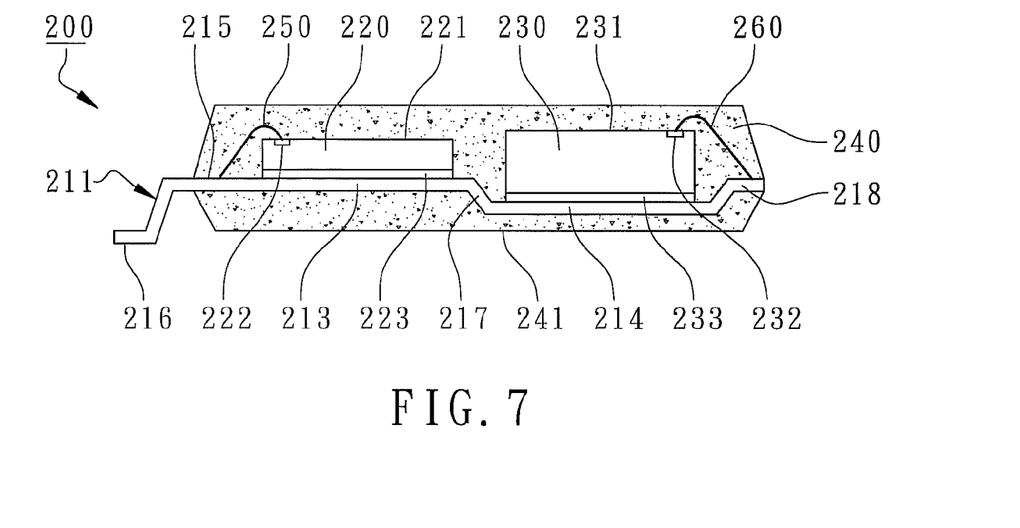
FIG. 7 is a cross-sectional view of the semiconductor package taken along the leads according to the third embodiment of the present invention.
Figure 8:
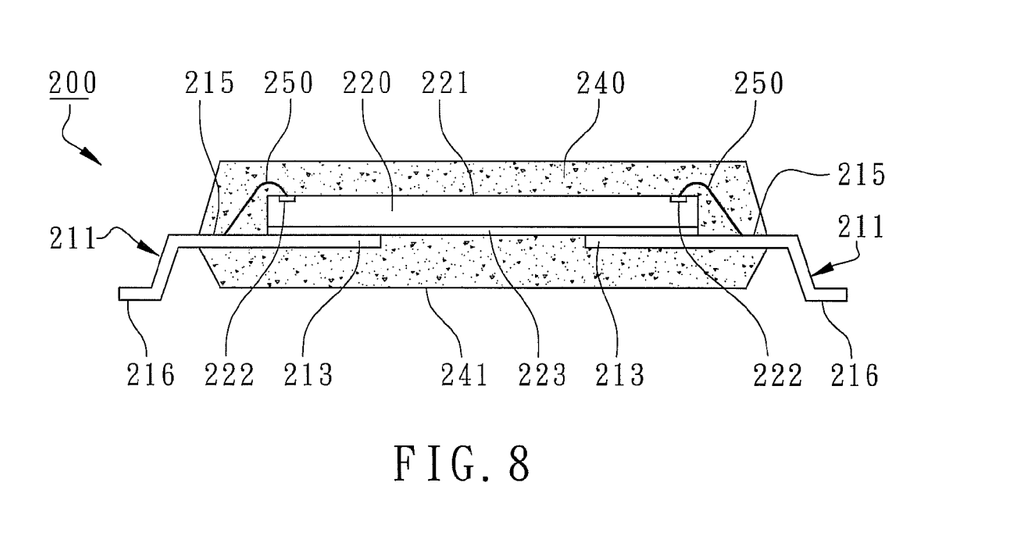
FIG. 8 is a cross-sectional view of the semiconductor package taken along a straight line across the first chip and the first die-attaching areas according to the third embodiment of the present invention.
Figure 9:
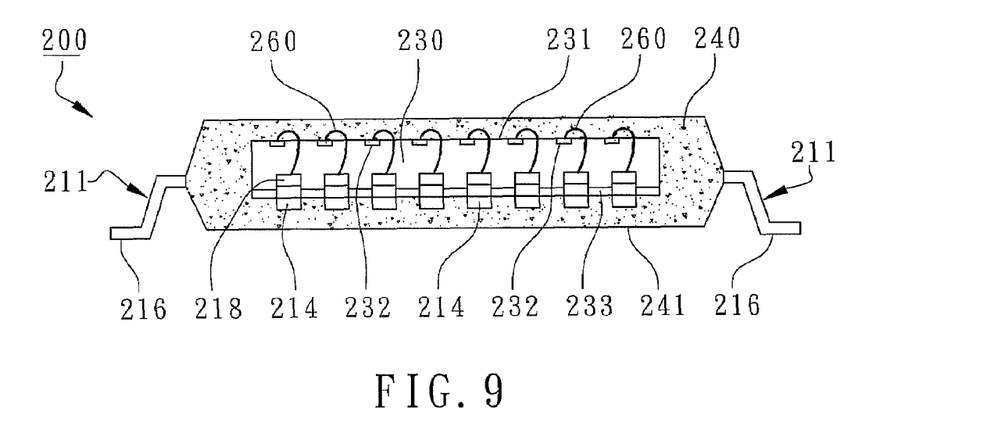
FIG. 9 is a cross-sectional view of the semiconductor package taken along a straight line across the second chip and the second die-attaching areas according to the third embodiment of the present invention.

According to the third embodiment of the present invention, another semiconductor package 200 is described in detail as in FIG. 6 to show the top view after removing some components and in FIGS. 7 to 9 to show different cross-sectional views. In the present embodiment, the semiconductor package 200 can be implemented in Chip-On-Lead (COL) packages where COL means the back surface of the chip, the surface corresponding to the active surface of the chip, is attached to the leads of a leadframe to firmly hold the chip during assembly processes.

The semiconductor package 200 primarily comprises a plurality of leads 211 of a leadframe 210, a first chip 220, a second chip 230, and an encapsulant 240. Each lead 211 has an internal lead portion 215 and an external lead portion 216 where the internal lead portion stands for a portion of the lead is encapsulated in an encapsulant and the external lead portion stands for a portion of the lead is extended and exposed outside the encapsulant. The internal lead portion 215 includes a first die-attaching area 213, a tilted lead portion 217, and a second die-attaching area 214 where the tilted lead portion 217 integrally connects the first die-attaching area 213 and the second die-attaching area 214. The leads 211 are made from the same metal material as the leadframe 210 which can be iron, copper, or other metal materials and have appropriate thicknesses strong enough to carry the first chip 220 and the second chip 230. As shown in FIG. 8, in the present embodiment, the first die-attaching areas 213 are connected to the corresponding external lead portions 216. As shown in FIG. 6, the first die-attaching areas 213 of the leads 211 are inwardly extended from two corresponding sides of the encapsulant 240 toward the first chip 220 and then further horizontally bent toward the second chip 230 and connected with the tilted lead portions 217.

The first chip 220 is disposed on the first die-attaching areas 213 of the internal lead portions 215. As shown in FIG. 8, the first chip 220 has a first active surface 221 and a plurality of first bonding pads 222 disposed on the first active surface 221. The first chip 220 is attached to the first die-attaching areas 213 of the leads 210 by a first die-attaching material 223.

The second chip 230 is disposed on the second die-attaching areas 214 of the internal lead portions 215 in side-by-side relationship with the first chip 220. As shown in FIG. 9, the second chip 230 has a second active surface 231 and a plurality of second bonding pads 232 disposed on the second active surface 231. The second chip 230 is attached to the second die-attaching areas 214 by the second die-attaching material 233.

To be more specific, as shown in FIG. 6, the internal lead portion 215 further comprises a plurality of bonding finger 218 connected with the corresponding second die-attaching areas 214. Preferably, the bonding fingers 218 are disposed in the same horizontal plane as the first die-attaching area 213 to shorten the length of bonding wires. As shown in FIG. 8, the semiconductor package 200 further comprises a plurality of first bonding wires 250 to electrically connect the first bonding pads 222 of the first chip 220 to the first die-attaching area 213 of the leads 211. As shown in FIG. 9, the semiconductor package 200 further comprises a plurality of second bonding wires 260 to electrically connect the second bonding pads 232 of the second chip 230 to the bonding fingers 218 of the leads 211.

The encapsulant 240 encapsulates the internal lead portions 215, the first chip 220, and the second chip 230 with the external lead portions 216 exposed. Moreover, the chip thickness of the second chip 230 is larger than the one of the first chip 220 and the second die-attaching areas 214 are downset relative to the first die-attaching areas 213 to make the bottom surface 241 of the encapsulant 240 is closer to the second die-attaching areas 214 than to the first die-attaching areas 213. As shown in FIG. 7, the downset depth of the second die-attaching areas 214 relative to the first die-attaching areas 213 is approximately half of the chip thickness difference between the second chip 230 and the first chip 220.

Therefore, the first chip 220 and the second chip 230 with difference chip thicknesses can be attached to the first die-attaching areas 213 and the second die-attaching areas 214 to improve the issue of unbalanced mold flows. Furthermore, since the second die-attaching areas 214 are downset disposed, so that the issue of the second bonding wires 260 exposed from the top surface of the encapsulant 240 can be avoided. Moreover, the second die-attaching areas 214 are connected to a fixed object, not shown in the figure, through the bonding fingers 218 which is coplanar with the first die-attaching areas 213 where the fixed object can be tie bars of a leadframe, turbulent plates, or tapes connected to the leadframe to get better strengths to avoid tilting during assembly processes.

Figure 10:
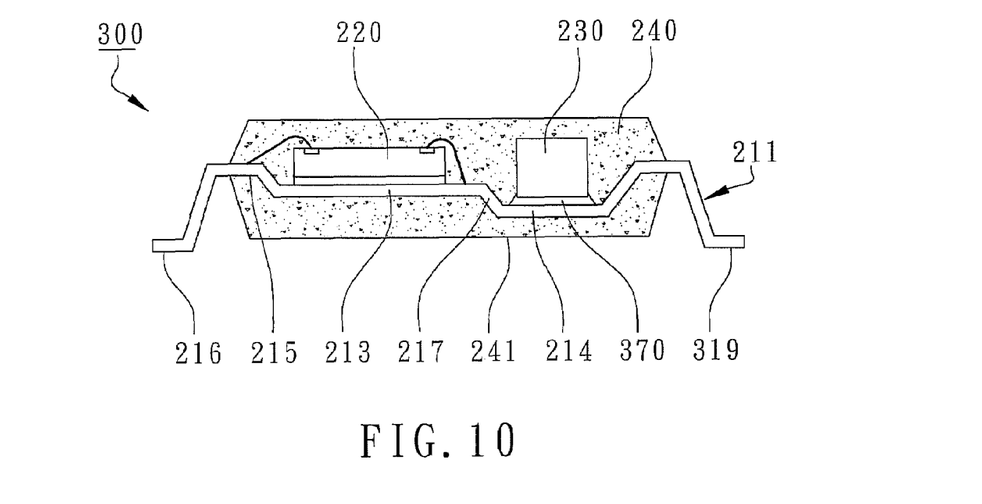
FIG. 10 is a cross-sectional view of another semiconductor package taken along the leads across the first and second chips according to the fourth embodiment of the present invention.

According to the fourth embodiment of the present invention, another semiconductor package 300 is described in detail in FIG. 10 to show the cross-sectional view. The basic structure of the semiconductor package 300 is about the same as the third embodiment. The figure numbers of the major components are the same without any detail descriptions. The semiconductor package 300 primarily comprises a plurality of leads 211 of a leadframe 210, a first chip 220, a second chip 230, and an encapsulant 240. Each lead 211 has an internal lead portion 215 and an external lead portion 216 where the internal lead portion 215 includes a first die-attaching area 213, a second die-attaching area 214, and a tilted lead portion 217 where the tilted lead portion 217 integrally connects the first die-attaching area 213 and the second die-attaching area 214. The external lead portions 216 are connected to the first die-attaching areas 213 of the corresponding internal lead portions 215. In the present embodiment, each lead 211 further has a second external lead portions 319 adjacent to the corresponding second die-attaching area 214. The first chip 220 is disposed on the first die-attaching areas 213 and the second chip 230 on the second die-attaching areas 214 respectively. In the present embodiment, as shown in FIG. 10, the second chip 230 can be a passive component such as 0201 passive component having two electrodes soldered to the second die-attaching areas 214 by solder 370. The encapsulant 240 encapsulates the internal lead portions 215, the first chip 220, and the second chip 230 with the external leads 216 and 319 exposed where the chip thickness of the second chip 230 is larger than the one of the first chip 220. The second die-attaching area 214 is downset relative to the first die-attaching area 213 in a manner that the bottom surface 241 of the encapsulant 240 is closer to the second die-attaching areas 214 than to the first die-attaching areas 213. Conventional issues of unbalanced mold flows and package warpage are solved when plural chips are side-by-side disposed on a leadframe.

The above description of embodiments of this invention is intended to be illustrative but not limiting. Other embodiments of this invention will be obvious to those skilled in the art in view of the above disclosure.

What is claimed is:

1. A semiconductor package primarily comprising:
   a plurality of leads and a die pad of a leadframe, the die pad including a first die-attaching area and a second die-attaching area, wherein the first die-attaching area and the second die-attaching area are horizontally disposed;
   a first chip disposed on the first die-attaching area;
   a second chip disposed on the second die-attaching area in side-by-side relationship with the first chip; and
   an encapsulant encapsulating a plurality of internal lead portions of the leads, the die pad, the first chip, and the second chip;
   wherein the thickness of the second chip is larger than the one of the first chip, and the second die-attaching area is downset relative to the first die-attaching area in a manner that a bottom surface of the encapsulant is closer to the second die-attaching area than to the first die-attaching area.

2. The semiconductor package as claimed in claim 1, where the downset depth of the second die-attaching area is about half of the chip thickness difference between the second chip and the first chip.

3. The semiconductor package as claimed in claim 1, wherein the second die-attaching area is a daughter die pad.

4. The semiconductor package as claimed in claim 1, wherein the first die-attaching area is downset relative to the internal lead portions of the leads, wherein the downset depth of the first die-attaching area is smaller than the one of the second die-attaching area.

5. The semiconductor package as claimed in claim 1, further comprising a plurality of first bonding wires electrically connecting the first chip to the internal lead portions of the leads.

6. The semiconductor package as claimed in claim 5, further comprising a plurality of second bonding wires electrically connecting the second chip to the internal lead portions of the leads.

7. A semiconductor package primarily comprising:
   a plurality of leads of a leadframe, each lead having an internal lead portion and an external lead portion, the internal lead portion including a first die-attaching area, a second die-attaching area, and a tilted lead portion, wherein the first die-attaching area and the second die-attaching area are horizontally disposed and connected together by the tilted lead portion;
   a first chip disposed on the first die-attaching areas;
   a second chip disposed on the second die-attaching areas in side-by-side relationship with the first chip; and
   an encapsulant encapsulating the internal lead portions of the leads, the first chip and the second chip with the external lead portions exposed;
   wherein the thickness of the second chip is larger than the one of the first chip, and the second die-attaching areas of the leads are downset relative to the ones of the first die-attaching areas in a manner that a bottom surface of the encapsulant is closer to the second die-attaching areas than to the first die-attaching areas.

8. The semiconductor package as claimed in claim 7, wherein the downset depth of the second die-attaching areas is about half of the chip thickness difference between the second chip and the first chip.

9. The semiconductor package as claimed in claim 7, wherein the first die-attaching areas are connected to the external lead portions of the corresponding leads.

10. The semiconductor package as claimed in claim 7, wherein the internal lead portion of each lead further includes a bonding finger connected with the second die-attaching area.

11. The semiconductor package as claimed in claim 10, further comprising a plurality of first bonding wires electrically connecting the first chip to the internal lead portions of the leads.

12. The semiconductor package as claimed in claim 11, further comprising a plurality of second bonding wires electrically connecting the second chip to the bonding fingers of the leads.

13. The semiconductor package as claimed in claim 9, wherein the internal lead portion of each lead further includes a bonding finger connected with the second die-attaching area, and the bonding fingers are disposed in a same horizontal plane as the first die-attaching areas.

14. The semiconductor package as claimed in claim 7, wherein the second chip is a passive component.

* * * * *